United States Patent
Rudloff et al.

(10) Patent No.: US 11,148,940 B2
(45) Date of Patent: Oct. 19, 2021

(54) MICROELECTROMECHANICAL COMPONENT AND METHOD FOR PRODUCING SAME

(71) Applicant: FRAUNHOFER-GESELLSCHAFT ZUR FOERDERUNG DER ANGEWANDTEN FORSCHUNG E.V., Munich (DE)

(72) Inventors: Dirk Rudloff, Dresden (DE); Martin Friedrichs, Dresden (DE); Sebastian Doering, Dresden (DE); Arnd Huerrich, Radebeul (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/754,384

(22) PCT Filed: Oct. 8, 2018

(86) PCT No.: PCT/EP2018/077310
§ 371 (c)(1),
(2) Date: Apr. 8, 2020

(87) PCT Pub. No.: WO2019/081192
PCT Pub. Date: May 2, 2019

(65) Prior Publication Data
US 2020/0239303 A1      Jul. 30, 2020

(30) Foreign Application Priority Data
Oct. 23, 2017   (DE) ..................... 10 2017 218 883.9

(51) Int. Cl.
*B81C 1/00*  (2006.01)
*B81B 7/00*  (2006.01)
*G02B 26/08*  (2006.01)

(52) U.S. Cl.
CPC ........ *B81C 1/00801* (2013.01); *B81B 7/0025* (2013.01); *B81B 2201/042* (2013.01);
(Continued)

(58) Field of Classification Search
CPC ........ B81C 1/00801; B81C 2201/0132; B81C 2201/0133; B81C 2201/0176;
(Continued)

(56) References Cited

U.S. PATENT DOCUMENTS

| 5,596,219 A * | 1/1997 | Hierold | ................. B81B 3/0081 |
| | | | 257/415 |
| 7,568,399 B2 * | 8/2009 | Sparks | ................. G01F 1/8445 |
| | | | 73/204.26 |

(Continued)

FOREIGN PATENT DOCUMENTS

| DE | 602004010729 | 12/2008 |
| KR | 100758641 | 9/2007 |

OTHER PUBLICATIONS

International Search Report.
German Office Action.

*Primary Examiner* — Yasser A Abdelaziez
(74) *Attorney, Agent, or Firm* — Jacobson Homan PLLC

(57) ABSTRACT

In a microelectromechanical component according to the invention, at least one microelectromechanical element (5), electrical contacting elements (3) and an insulation layer (2.2) and thereon a sacrificial layer (2.1) formed with silicon dioxide are formed on a surface of a CMOS circuit substrate (1) and the microelectromechanical element (5) is arranged freely movably in at least a degree of freedom. At the outer edge of the microelectromechanical component, extending
(Continued)

radially around all the elements of the CMOS circuit, a gas- and/or fluid-tight closed layer (4) which is resistant to hydrofluoric acid and is formed with silicon, germanium or aluminum oxide is formed on the surface of the CMOS circuit substrate (1).

11 Claims, 23 Drawing Sheets

(52) U.S. Cl.
CPC . *B81B 2207/015* (2013.01); *B81C 2201/0109* (2013.01); *B81C 2201/0132* (2013.01); *B81C 2201/0133* (2013.01); *B81C 2201/0176* (2013.01); *B81C 2201/0181* (2013.01); *B81C 2203/0735* (2013.01); *G02B 26/0833* (2013.01)

(58) Field of Classification Search
CPC .... B81C 2201/0181; B81C 2203/0735; B81C 1/00246; B81C 2201/014; B81C 1/00476; B81C 2203/0771; B81C 2201/0109; B81B 7/0025; B81B 2201/042; B81B 2207/015; G02B 26/0833
See application file for complete search history.

(56) References Cited

U.S. PATENT DOCUMENTS

| | | | |
|---|---|---|---|
| 8,440,523 B1* | 5/2013 | Guillorn | B81C 1/00396 |
| | | | 438/243 |
| 8,847,339 B2* | 9/2014 | Merz | H01L 23/5228 |
| | | | 257/415 |
| 2010/0289065 A1 | 11/2010 | Hsu et al. | |
| 2012/0261830 A1 | 10/2012 | Chu et al. | |
| 2013/0161702 A1* | 6/2013 | Chen | B81C 1/00246 |
| | | | 257/254 |
| 2015/0357375 A1 | 12/2015 | Tsai et al. | |
| 2016/0068388 A1 | 3/2016 | Daneman et al. | |
| 2016/0137494 A1* | 5/2016 | Tanaka | H01L 21/76264 |
| | | | 257/419 |
| 2016/0264399 A1 | 9/2016 | Cheng et al. | |
| 2017/0297901 A1 | 10/2017 | Huang et al. | |

\* cited by examiner

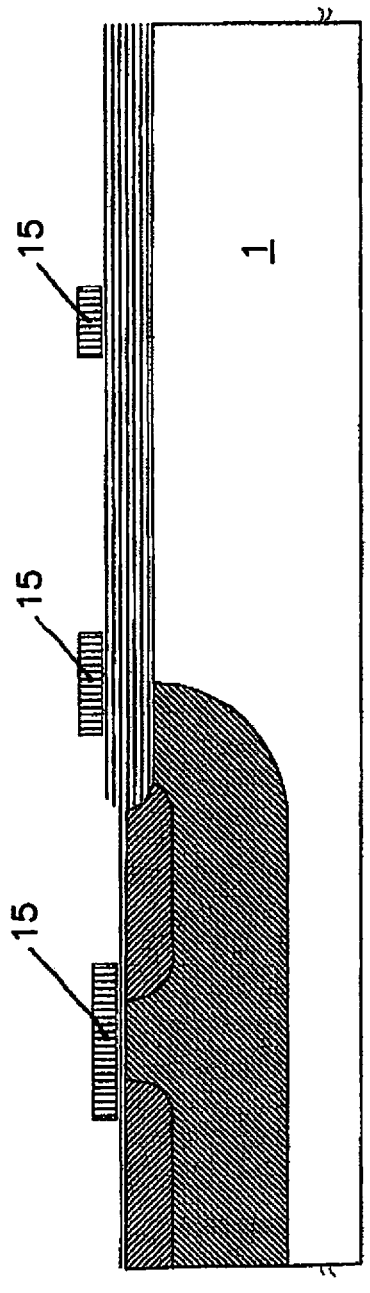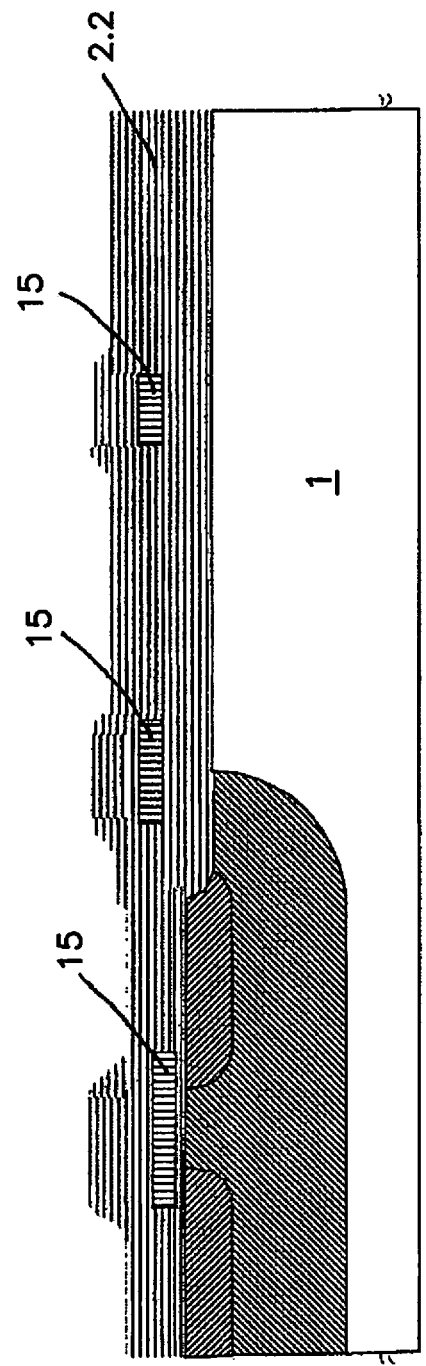
FIG. 2
FIG. 3

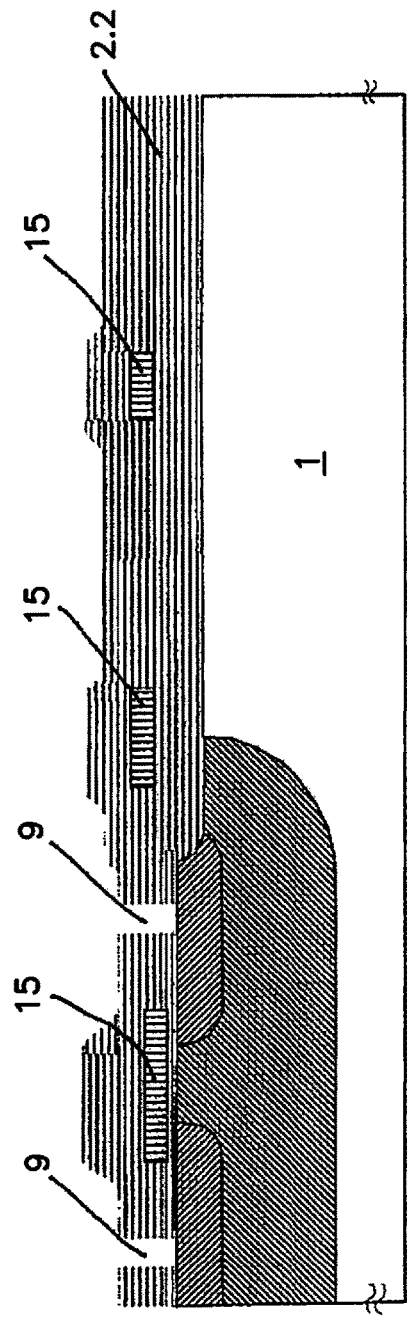
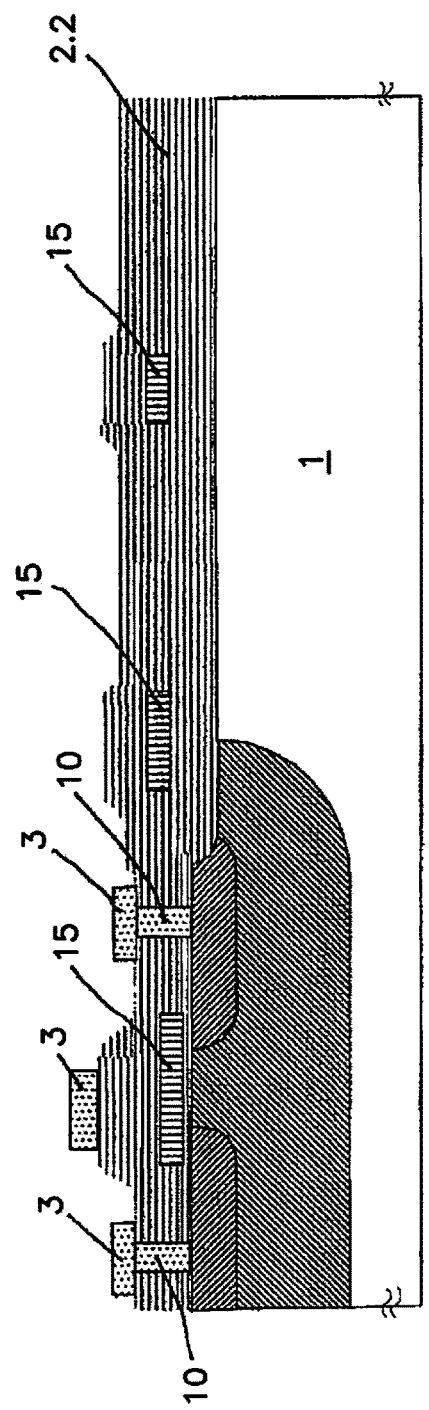

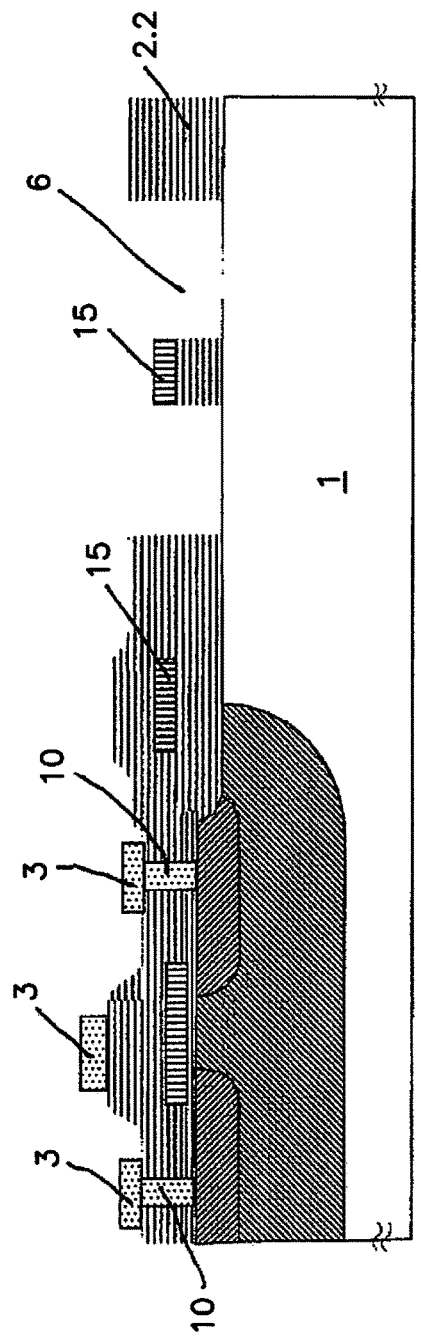
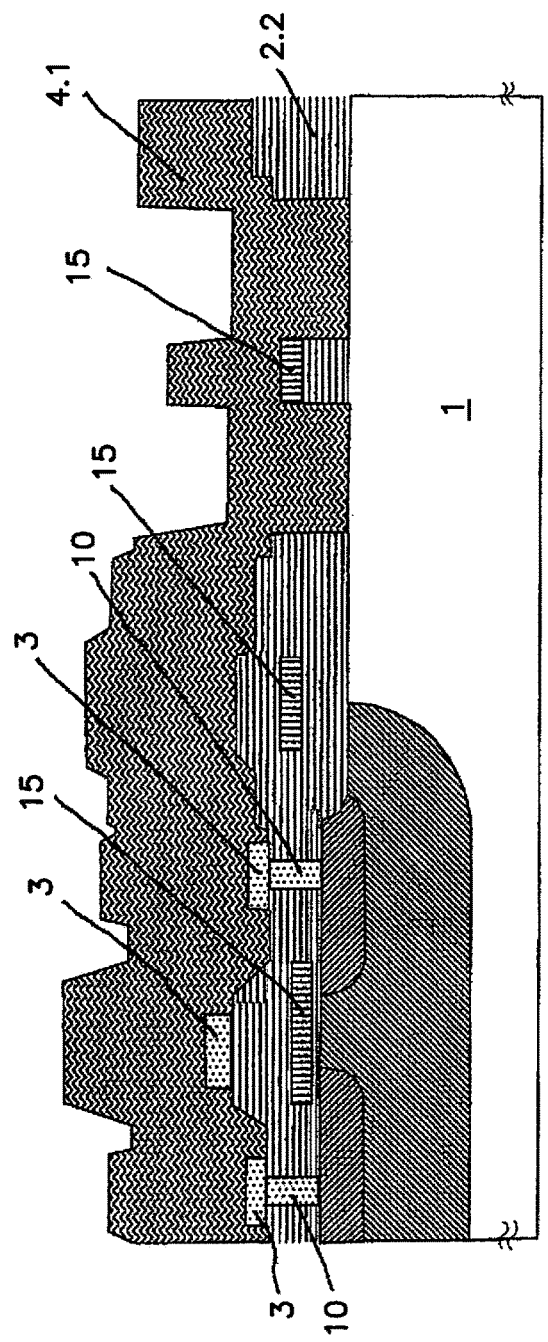
FIG. 6
FIG. 7

MICROELECTROMECHANICAL COMPONENT AND METHOD FOR PRODUCING SAME

BACKGROUND OF THE INVENTION

The invention relates to microelectromechanical components and to a method for producing same.

The invention is intended to be applied to microelectromechanical components (MEMS components) arranged on CMOS circuits. The production of MEMS components makes use of various micromechanical production methods, inter alia the use of sacrificial layers. The latter are often produced from silicon dioxide. In order to ensure the later movability of the MEMS component, the sacrificial layer has to be removed regionally (release process). In the case of silicon dioxide, this can be achieved by means of etching using hydrofluoric acid (HF), which is used either in liquid or in gaseous form. If the MEMS component is arranged on a CMOS circuit, then the silicon dioxide layers likewise present in the CMOS circuit have to be protected against a possible attack by hydrofluoric acid, in order to ensure their functionality as gate oxide or insulator between different metal layers. In the CMOS part, in particular, doped silicon dioxide layers composed e.g. of borophosphosilicate glass (BPSG) are often used. The latter exhibit a significantly higher etching rate than the undoped silicate glass (USG) in the sacrificial layers and are therefore particularly susceptible during etching using hydrofluoric acid. If the etching attack occurs within the CMOS region, short circuits or delamination of layers can occur. In the event of attack from the outer edge, excessively extensive delamination can result in electrical contact (bond pads) and functional parts of the MEMS component becoming detached from the CMOS circuit used. Wire bonding and hence a use of a MEMS component affected in this way are then no longer possible. Therefore, the CMOS region of the MEMS component must be effectively protected against a possible attack during the release process.

There are a number of studies investigating the prevention of an attack on the top side of a CMOS circuit, on which lies the MEMS part of a MEMS component. Hitherto the lateral protection of the CMOS circuit has largely been disregarded and only general protection or protection from above, that is to say from the direction of the overlying MEMS part, has been tackled. Protection of the CMOS is tackled e.g. in US 2016/0068388 A1, which proposes an additional metal layer covering a surface. This constitutes a simple and presumably also often used method. Titanium, titanium nitride, aluminium and aluminium-copper were proposed as materials. It is also noted in US 2016/0068388 A1, however, that the materials do not exhibit complete resistance to hydrofluoric acid, but rather corrode and, consequently, can ensure effective protection only for a certain duration. Therefore, the thickness must be chosen to be sufficiently large.

SUMMARY OF THE INVENTION

It is therefore an object of the invention to specify possibilities for improved protection of a CMOS circuit of a MEMS component in the course of exposing a microelectromechanical element for the free movability thereof by removing silicon dioxide as sacrificial material by means of an etching process (release process) and in particular to avoid delaminations in this case.

This object is achieved according to the invention by means of a component having the features of the invention. Advantageous configurations and developments of the invention can be realized with further features of the invention.

In a microelectromechanical component according to the invention, at least one microelectromechanical element, electrical contacting elements and a sacrificial layer formed with silicon dioxide are formed on a surface of a CMOS circuit substrate. In this case, the microelectromechanical element is arranged freely movably in at least one degree of freedom, as is known from the prior art. According to the invention, at the outer edge of the microelectromechanical component, extending radially around all the elements of the CMOS circuit, a gas- and/or fluid-tight closed layer which is resistant to hydrofluoric acid and is formed with silicon or aluminium oxide is formed on the surface of the CMOS circuit substrate.

Said layer forms a guard ring extending radially around and prevents the etchant, in particular hydrofluoric acid, from attacking regions critical therefor, in particular of the CMOS circuit. The layer material should be resistant to hydrofluoric acid during the removal of sacrificial layer material by etching at least until the sacrificial layer material has been removed to a sufficient extent and a movability of a respective microelectromechanical element is attained.

Advantageously, the layer should be formed with amorphous silicon (aSi) and preferably with doped amorphous silicon. Boron, in particular, can be used for the doping. Alternatively, however, aluminium oxide, germanium or a chemical compounds composed of silicon and germanium would also be conceivable.

The silicon dioxide need not be pure silicon dioxide. The silicon dioxide can also contain dopings or additives and e.g. borophosphosilicate glass can thus be used.

It is also advantageous if a barrier layer composed of aluminium oxide is formed at that surface of the microelectromechanical component at which the microelectromechanical element is arranged movably. Said barrier layer can protect, against an etching attack, in particular electrical contacting elements arranged below the barrier layer in the sacrificial layer.

Advantageously, a layer which extends radially around and which is formed with silicon or aluminium oxide can have a larger height, such that it projects laterally beyond the surface of the CMOS circuit substrate and can also afford lateral protection against an attack by the etchant used.

The layer extending radially around should have a height which corresponds at least to the height of the CMOS layer construction. It can also be embodied such that it can form a guard ring around the CMOS circuit. In this case, it can be embodied proceeding from the surface of the CMOS circuit substrate as far as a barrier layer directly as far as the underside of the microelectromechanical element.

There is also the possibility of the layer formed with silicon, aluminium oxide, germanium or a chemical compound of silicon and germanium being overcoated with at least one further layer. At least one further layer can be formed preferably with a metal, particularly preferably with titanium, aluminium, aluminium-copper alloy or a titanium-aluminium alloy or titanium nitride. Said further layer, too, can protect parts of the CMOS circuit and electrical contacting elements arranged within the sacrificial layer against an etching attack, in particular proceeding from the edge of the MEMS component. The layer formed with silicon or aluminium oxide then predominantly protects the surface of the CMOS circuit substrate.

Microelectromechanical elements can be, for example, pivotable reflective elements (micromirrors) or membranes.

The procedure during the production of a MEMS component according to the invention is such that an insulator layer formed with silicon dioxide is applied on a surface of the CMOS circuit substrate and in the process electrical contacting elements or electrical conductor tracks are embedded into the insulator layer in a locally defined manner, as is known from the prior art. According to the invention, in the insulator layer at the outer edge at least one trench extending as far as the surface of the CMOS circuit substrate is formed in a manner extending radially around all the elements of the CMOS circuit. Afterward, the trench, at least in its bottom region, is filled with a fluid- and/or gas-tight closed layer formed with silicon or aluminium oxide. The tightness should take account of the state of matter of the etchant, in particular of the hydrofluoric acid during the use thereof for removing sacrificial layer material. Furthermore, the material of which the tight layer extending around consists must itself be resistant to the hydrofluoric acid used.

The tight closed layer can preferably also be formed with amorphous silicon and particularly preferably a chemical compound of silicon with boron or germanium.

Afterward, the method then continues optionally with forming further electrical contacting elements, electrical conductor tracks or electrodes, and a sacrificial layer is also formed. The sacrificial layer is likewise formed with silicon dioxide. The sacrificial layer material can be identical with the material for the insulator layer. However, the two materials can also have a different consistency by virtue of their being doped differently or by virtue of the silicon dioxide additionally containing other substances. The silicon dioxide used to form the insulator and/or sacrificial layer can contain additives known per se for glasses, in particular boron and phosphorus.

Any desired MEMS element is subsequently applied on this CMOS circuit provided with a protective layer extending around.

That is followed by removing sacrificial layer material by means of an etching method, with the result that a movability of the at least one microelectromechanical element is attained.

The trench can be filled predominantly with silicon or aluminium oxide, but preferably completely with silicon. The lateral protection against an etching attack can be additionally improved as a result.

The insulator layer can be formed progressively in a plurality of method steps in succession. Between these method steps, in a manner known per se, electrical contacting elements and/or electrical conductor tracks can be formed and embedded in the insulator layer material. Electrical contacting elements and electrodes can be embedded in the sacrificial layer and be exposed again by the etching.

As an alternative or in addition thereto, the layer can be covered with at least one further layer, which is formed preferably with a metal, particularly preferably with titanium, titanium nitride, aluminium, an aluminium-copper alloy or a titanium-aluminium alloy, in the trench.

Between the insulator layer and the sacrificial layer a closed barrier layer composed of aluminium oxide or silicon, in particular aSi, and on that surface of the barrier layer which faces in the direction of the at least one microelectromechanical element, further electrical contact elements and electrodes required for the actuation of the microelectromechanical element can also be formed, which are electrically conductively connected to electrical contacting elements arranged below the barrier layer. That is followed by removing material of the sacrificial layer above the barrier layer by etching, with the result that the movability of the microelectromechanical element is attained.

The silicon or aluminium oxide in the trench can be deposited by means of PE-CVD technology, sputtering or atomic layer deposition (ALD) and the layer can be formed therewith.

The use of boron-doped amorphous silicon aSiB or aluminium oxide, germanium or a chemical compound of silicon and germanium aSiGe as material affords the advantage over metals of being better or completely inert vis-à-vis hydrofluoric acid in liquid or gaseous form and thus of ensuring the desired protective effect during the release process even over a virtually unlimited time.

A further advantage is achieved by the ability of silicon, in particular of aSiB, germanium or a chemical compound of silicon and germanium aSiGe, to fill trenches. Silicon, germanium or a chemical compound of silicon and germanium that is deposited by means of PE-CVD technology can fill a trench provided as ring-shaped protection completely and without voids. Afterward, the silicon, in particular aSiB, or the germanium or the chemical compound of silicon and germanium aSiGe can be planarized. In contrast thereto, the metal layers used hitherto and already mentioned above are deposited by means of PVD methods and do not completely fill trenches in the process, but rather only the bottom and sidewalls. In this case, the thicknesses of these layers are usually significantly thinner than the desired thicknesses deposited in the unstructured region. A minimal layer thickness is present particularly at the transition from the trench bottom to the sidewall and the formation of microcracks increasingly occurs as a result of the mechanical conditions prevailing locally there. Besides the lower durability of the material, said microcracks constitute an additional leak and thus reduce the protective effect of trenches filled with metal. Such problems were able to be observed particularly at the corners of the components, at which undercuts increasingly occur as a result of the required radius of curvature of the guard ring formed with the layer. By contrast, with the use of trenches filled completely with silicon, in particular aSiB, germanium or a chemical compound formed with silicon and germanium, no leaks are to be expected since the total width and height of the silicon-filled guard ring formed with the layer turn out to be significantly wider and higher.

During the production of MEMS components according to the invention, it is possible to have recourse to methods known per se, such as have been customary hitherto.

DESCRIPTION OF THE DRAWINGS

The invention will be explained in greater detail below by way of example seen in the drawings.

FIG. 2 shows a sectional illustration through a standard CMOS circuit substrate;

FIG. 3 shows a sectional illustration through the CMOS circuit substrate, in which CMOS elements on its surface have been covered in a region with an insulator layer composed of silicon dioxide;

FIG. 4 shows a sectional illustration of the CMOS circuit according to FIG. 3, in which perforations (vias) have been formed through the insulator layer;

FIG. 5 shows a sectional illustration of the example according to FIG. 4, in which a metallization and structuring of the metal have been carried out in order to form electrical through contacts on the CMOS and electrical contacting elements;

FIG. 6 shows a sectional illustration through one example according to FIG. 5, in which through the perforations electrical through contacts (vias) at the radially outer edge around the elements of the CMOS circuit a trench extending radially around has been formed down to the silicon wafer;

FIG. 7 shows a sectional illustration of the CMOS circuit with the insulator layer according to FIG. 6, in which the surface has been coated with aSiB and the trench has been filled with aSiB in the process;

DETAILED DESCRIPTION OF THE DRAWINGS

With the following figures, the intention is to elucidate how an example of a MEMS component according to the invention can be produced progressively in method steps.

Figure 1A:
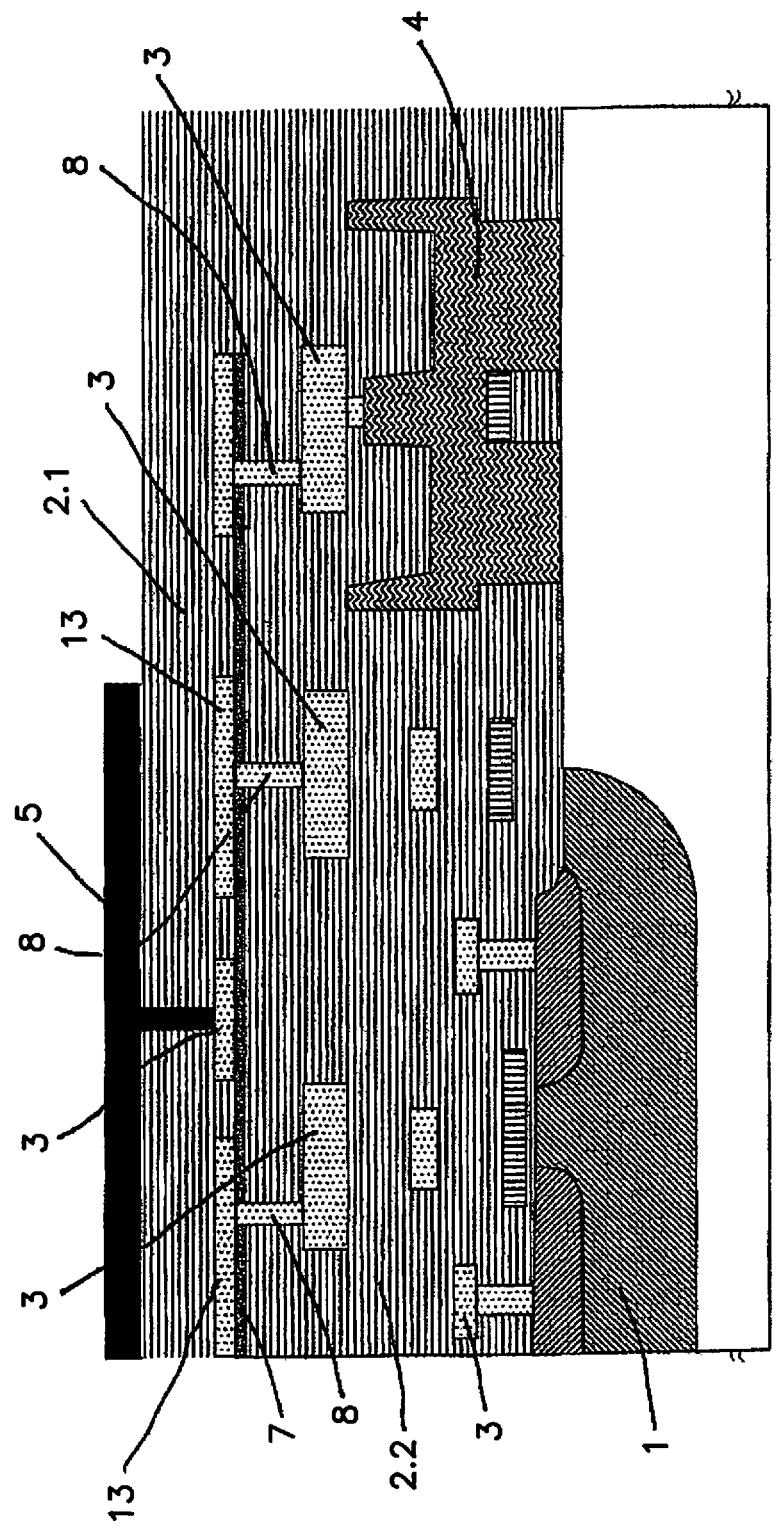
FIG. 1A shows a sectional illustration through one example of a MEMS component according to the invention, in which a micromechanical element is not yet freely movable.

FIG. 1A shows an example in which a micromechanical element 5 is not yet freely movable. In this case, on the surface of a CMOS circuit substrate 1, a sacrificial layer 2.1 is formed in the upper region of the MEMS component, said upper region being intended to be removed in order to attain the movability of the MEMS element 5, and underneath an insulator layer 2.2 composed of silicon dioxide is formed in the region of the CMOS circuit, a plurality of electrical contacting elements 3 being embedded in said insulator layer. At the radially outer edge of the MEMS component, a layer 4 composed of aSiB is formed in a manner extending around on the surface of the CMOS circuit substrate 1 and is enclosed by sacrificial and insulator layer material at the other surfaces.

A barrier layer 7 composed of aluminium oxide is formed at a distance from that surface of the sacrificial layer 2.1 against which the microelectromechanical element 5 still bears here, said barrier layer having perforations through which are led through the electrical through contacts 8 to electrical contacting elements 3. In this example, the microelectromechanical element 5 is intended to be a pivotable element that reflects electromagnetic radiation.

Figure 1B:
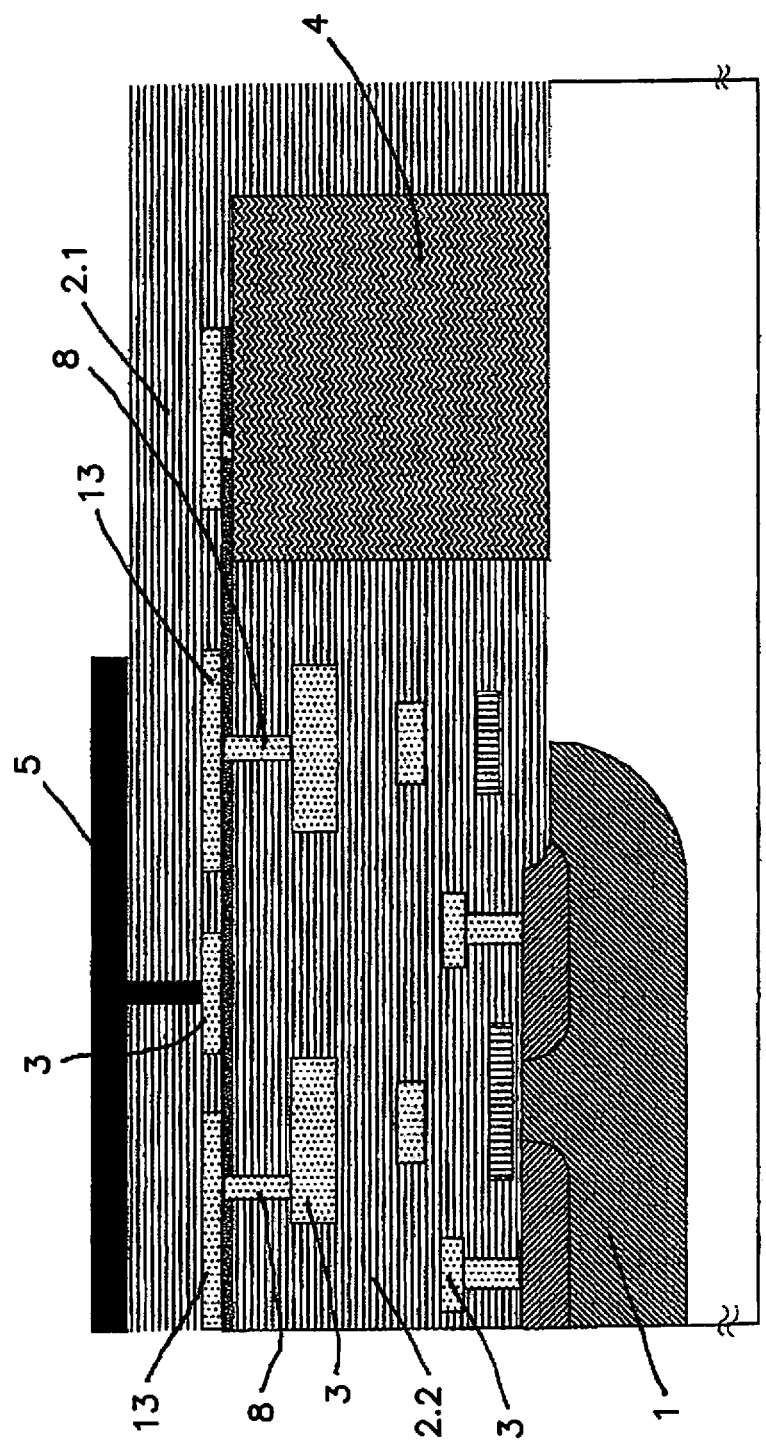
FIG. 1B shows a sectional illustration through a further example of a MEMS component according to the invention, in which a micromechanical element is not yet freely movable.

The example shown in FIG. 1B differs from the example according to FIG. 1A merely in the way in which the layer 4 is formed. Said layer is led as far as the barrier layer 7.

FIG. 2 shows a CMOS circuit substrate 1 with CMOS elements 15 that is available as standard as a starting point for production.

FIG. 3 shows how a region of an insulator layer 2.2 composed of silicon dioxide has been deposited on the surface of the CMOS circuit substrate 1 by means of a PE-CVD method.

Contact holes (vias) 9 were formed in a locally defined manner, by means of reactive ion etching, into the sacrificial layer 2 formed in this way, said contact holes being led from the surface of the heretofore formed region of the insulator layer 2.2 as far as electrical contacts of the CMOS circuit substrate 1 (FIG. 4).

Further electrical contactings 3 and electrical through contacts 10 were formed by deposition of a metal by sputtering and by lithographic patterning, which can be gathered from FIG. 5.

FIG. 6 shows how the semifinished product shown in FIG. 5 has been processed further by virtue of the fact that at the radially outer edge of the MEMS component in the material of the insulator layer 2.2 a trench 6 extending radially around has been formed by reactive ion etching, said trench extending as far as the surface of the CMOS circuit substrate 1.

FIG. 7 reveals how the entire surface has been coated with aSiB 4.1 by means of a PE-CVD method. The trench 6 was also filled completely with the aSiB 4.1 in the process.

Figure 8:
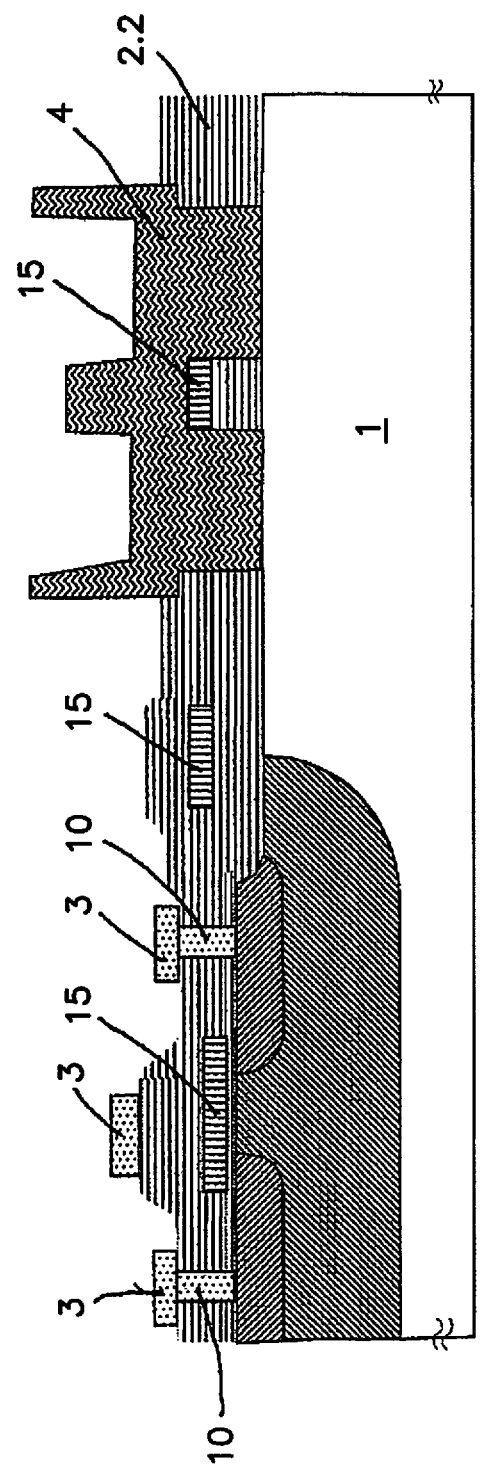
FIG. 8 shows a sectional illustration of the example shown in FIG. 7, in which a part of the deposited aSiB has been removed again apart from the trench region.

After that, aSiB 4.1 was removed in a locally defined manner lithographically and by reactive ion etching in a locally defined manner, such that it remains only in the region of the later guard ring as layer 4, which can be gathered from FIG. 8. The surface of the layer 4 need not be formed in a patterned manner as in this example, it can also be flat and planar, as is shown in FIG. 1b.

Figure 9:
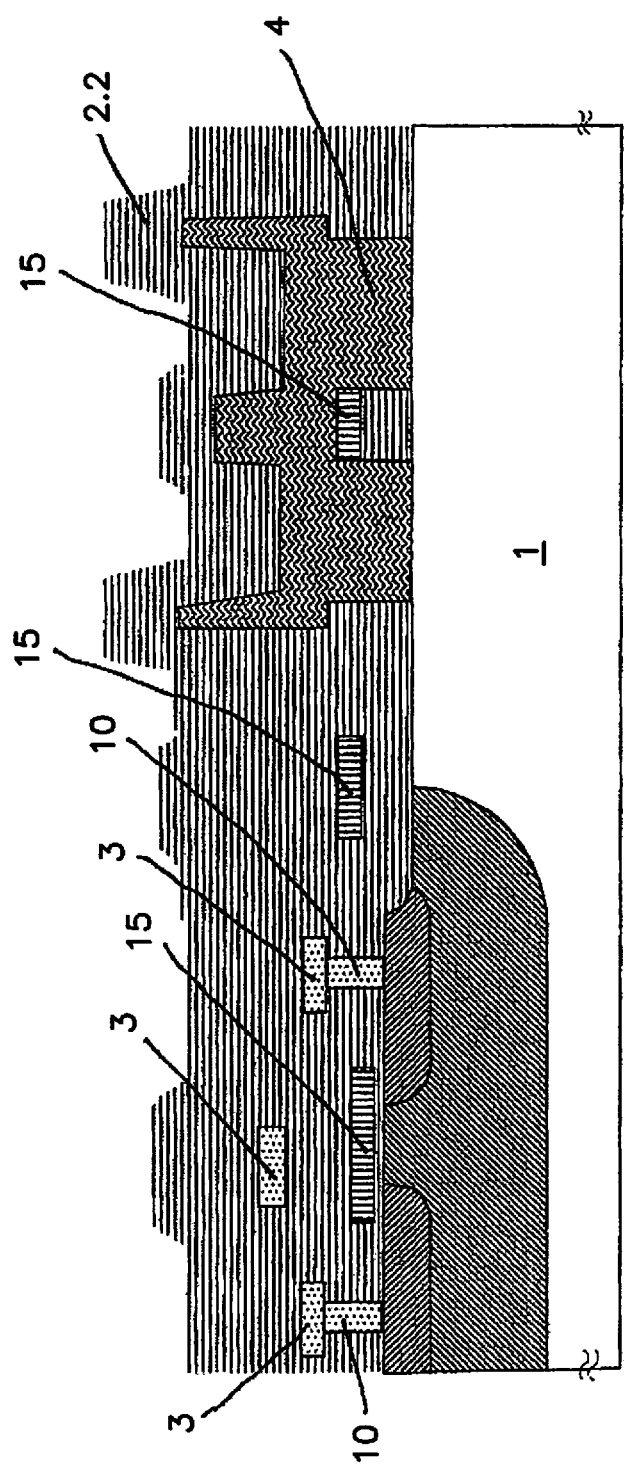
FIG. 9 shows a sectional illustration of the example according to FIG. 8, in which a further region has been formed with an insulator layer composed of silicon dioxide on the surface in a manner covering the trench filled with aSiB.

After that in turn, a region of the insulator layer 2.2 was deposited again by a PE-CVD method, such that the surface is formed completely with the silicon dioxide and the layer 4 is also covered therewith (FIG. 9).

Figure 10:
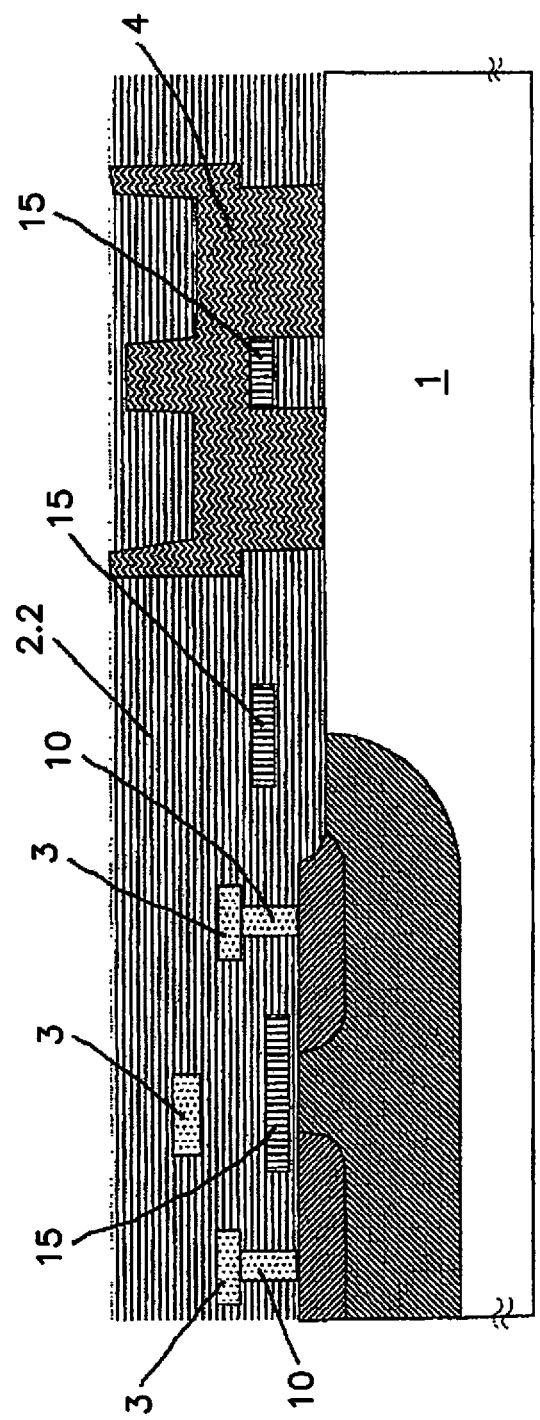
FIG. 10 shows a sectional illustration of the example according to FIG. 9, in which the surface of the insulator layer has been planarized.

FIG. 10 shows how the surface of the insulator layer 2.2 formed up until then and the aSiB forming the layer 4 have been planarized by means of chemical mechanical polishing.

Figure 11:
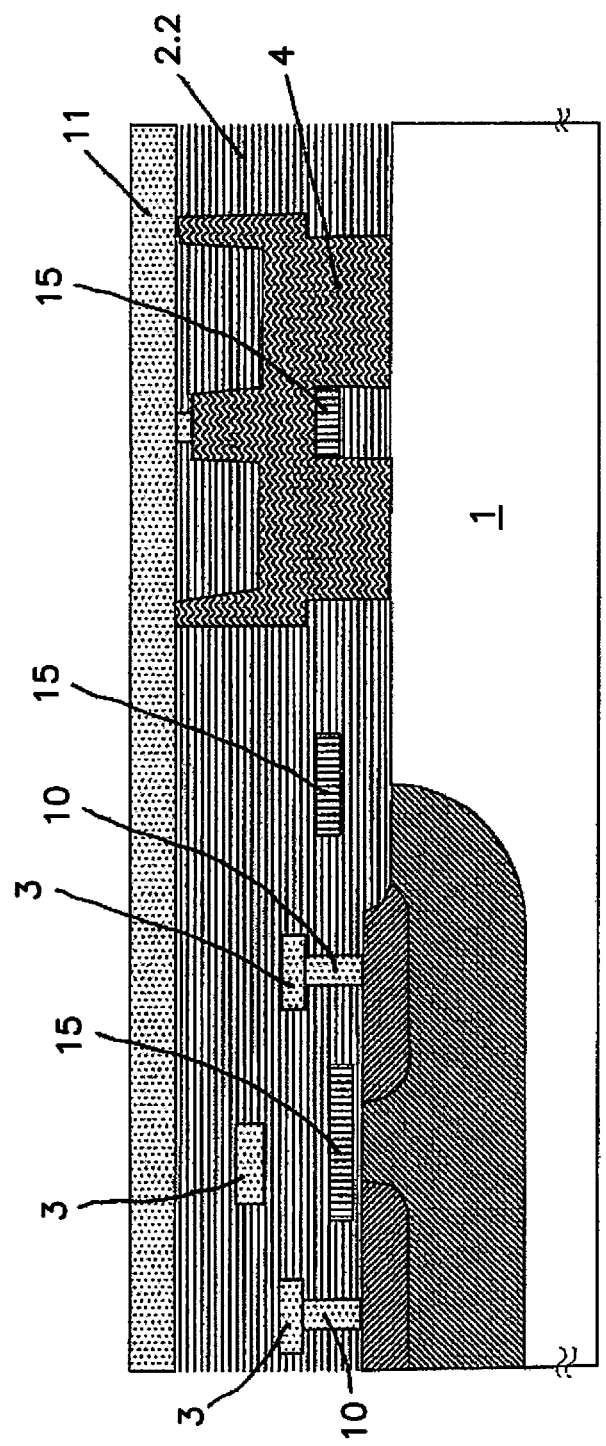
FIG. 11 shows a sectional illustration of the example according to FIG. 10, in which a perforation (via) has been shaped on the planarized surface and a metal layer having contact with the silicon layer has been formed in said perforation and also on the surface.

On the planarized surface of the insulator layer 2.2 formed up until then, a via 10 was etched and a continuous layer 11 composed of AlSiCu, said layer contacting the aSiB in the layer 4, was formed by sputtering (FIG. 11).

Figure 12:
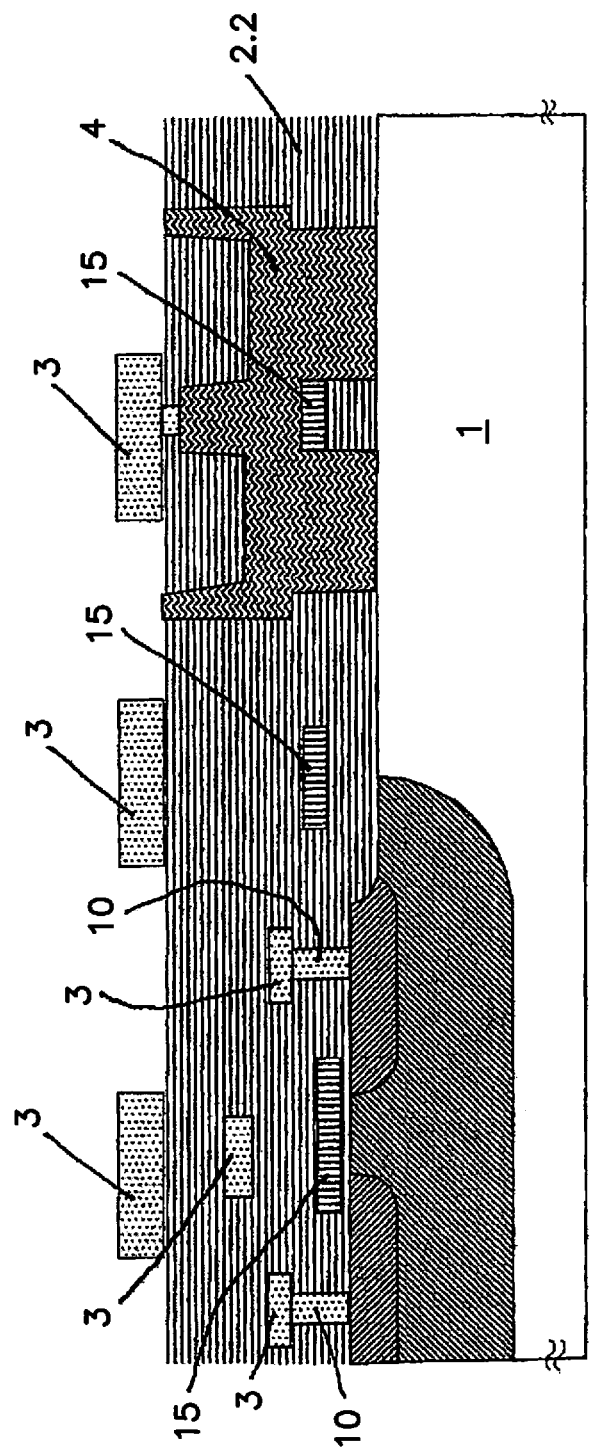
FIG. 12 shows a sectional illustration of the example according to FIG. 11, in which electrical contacting elements and electrical conductor tracks have been formed by locally defined removal of the metal layer.

It can be gathered from FIG. 12 how a part of the layer 11 has been removed in a locally defined manner lithographically and by etching and electrical contacting elements and/or conductor tracks 3 have been formed thereby.

Figure 13:
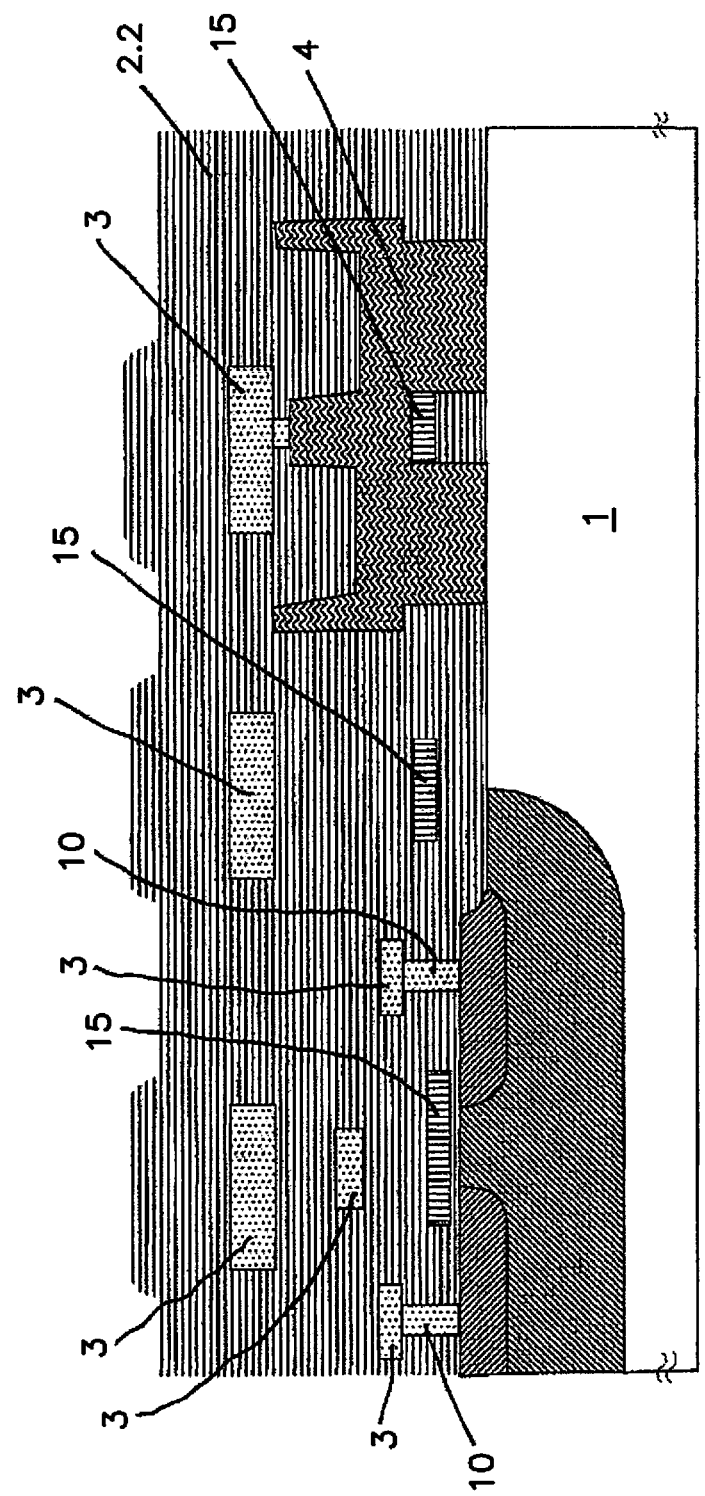
FIG. 13 shows a sectional illustration of the example according to FIG. 12, in which a further region of the insulator layer has been formed and the electrical contacting elements have been embedded therein.
Figure 14:
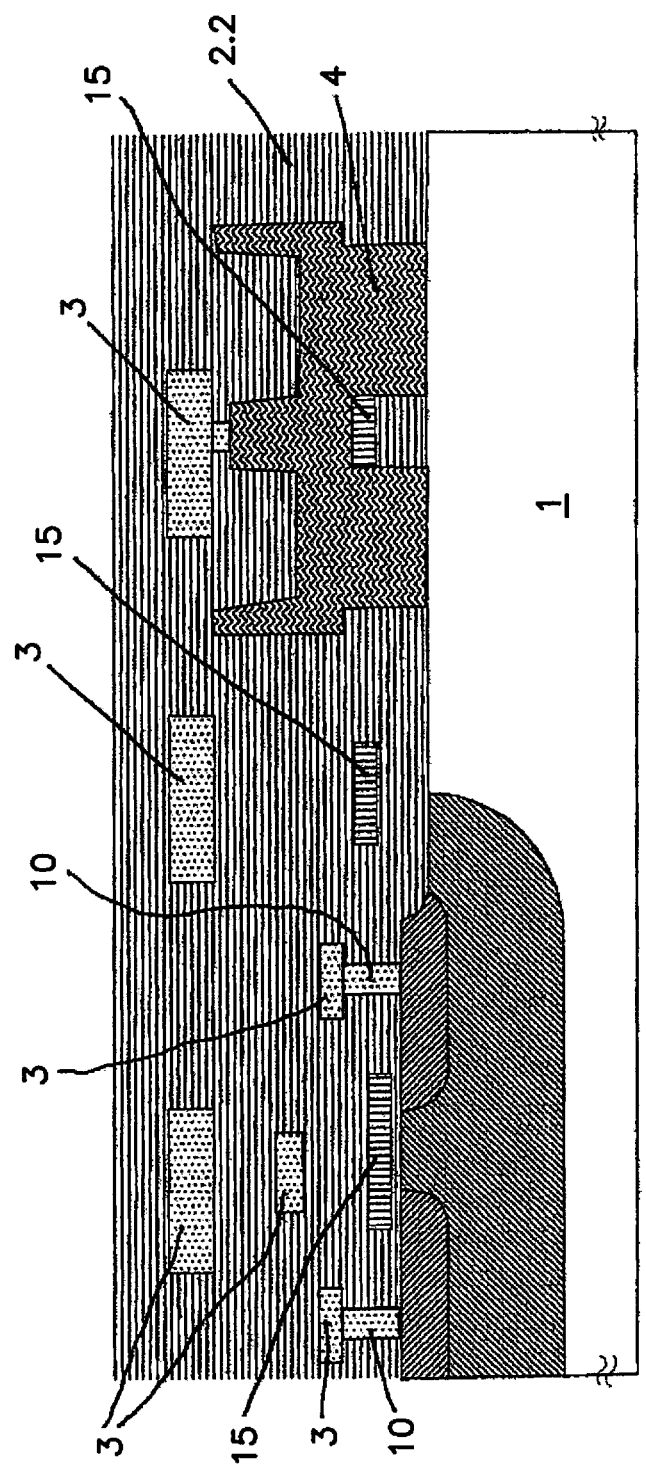
FIG. 14 shows a sectional illustration of the example according to FIG. 13, in which a planarization of the surface of the insulator layer has been carried out.

It can be gathered from FIGS. 13 and 14 that a further region of the insulator layer 2.2 is formed on the surface by means of a PE-CVD method and the electrical contacting elements 3 produced last are embedded therein. The surface of the insulator layer 2.2 was than planarized again by chemical mechanical polishing.

Figure 15:
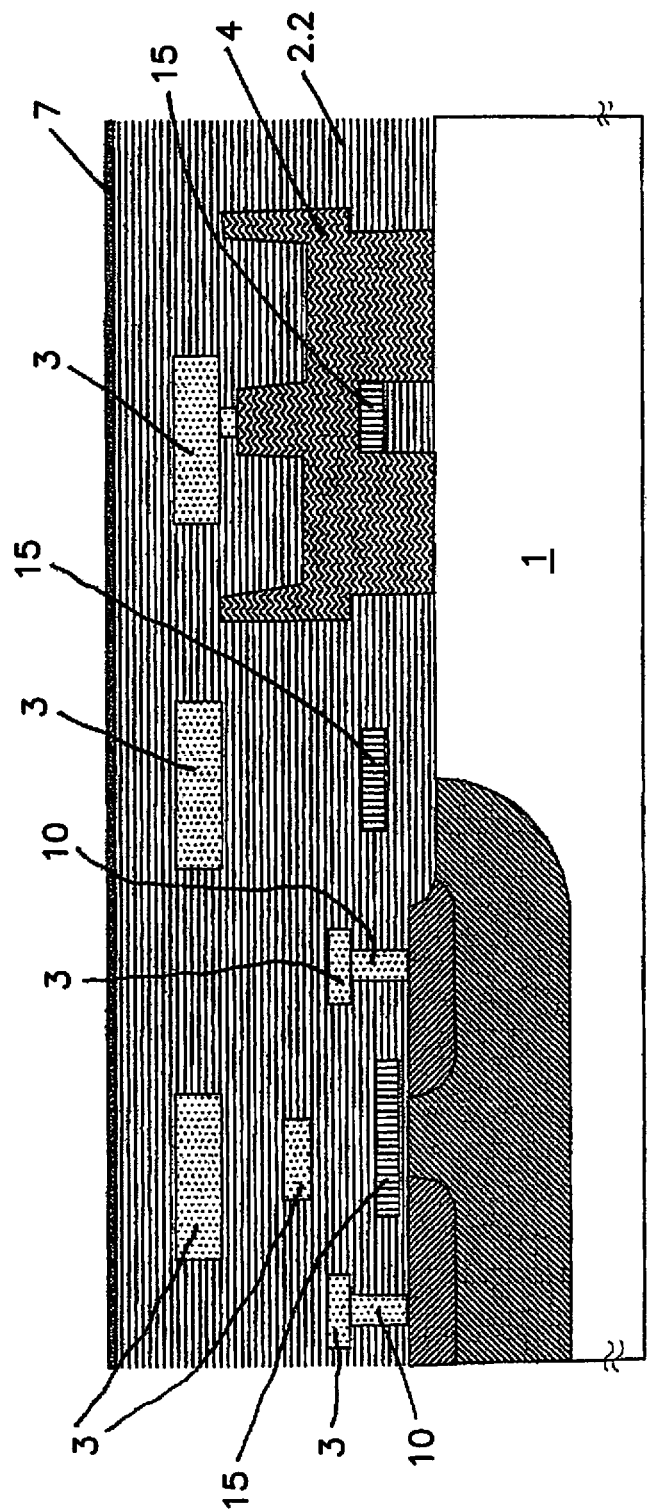
FIG. 15 shows a sectional illustration of the example according to FIG. 14, in which a barrier layer composed of aluminium oxide or aSi has been formed on the planarized surface of the sacrificial layer.

FIG. 15 shows the formation of a barrier layer 7 composed of aluminium oxide on the entire surface of the insulator layer 2.2. The barrier layer 7 can be formed by means of ALD (atomic layer deposition). It should form a closed layer.

Figure 16:
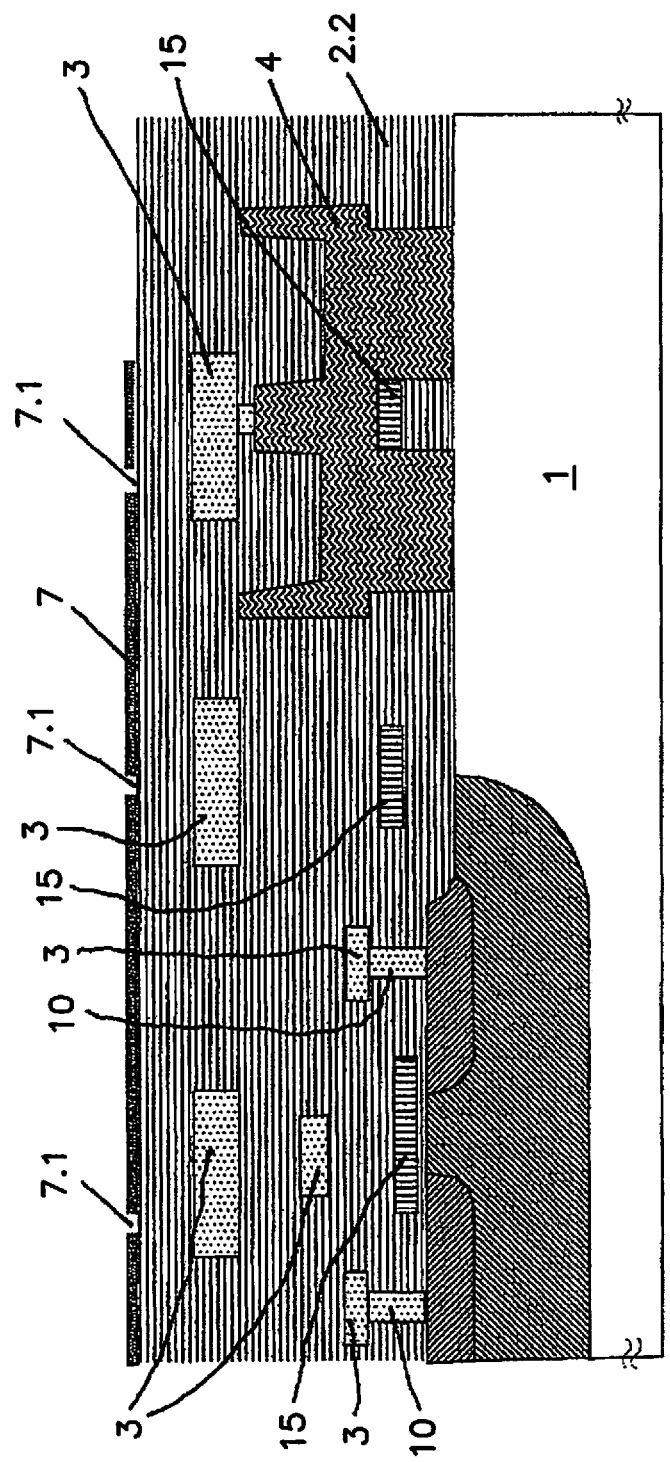
FIG. 16 shows a sectional illustration of the example according to FIG. 15, in which perforations have been formed in a locally defined manner through the barrier layer composed of aluminium oxide or aSi.

In accordance with FIG. 16, perforations 7.1 are formed into the barrier layer 7 in a locally defined manner by means of reactive ion etching.

Figure 17:
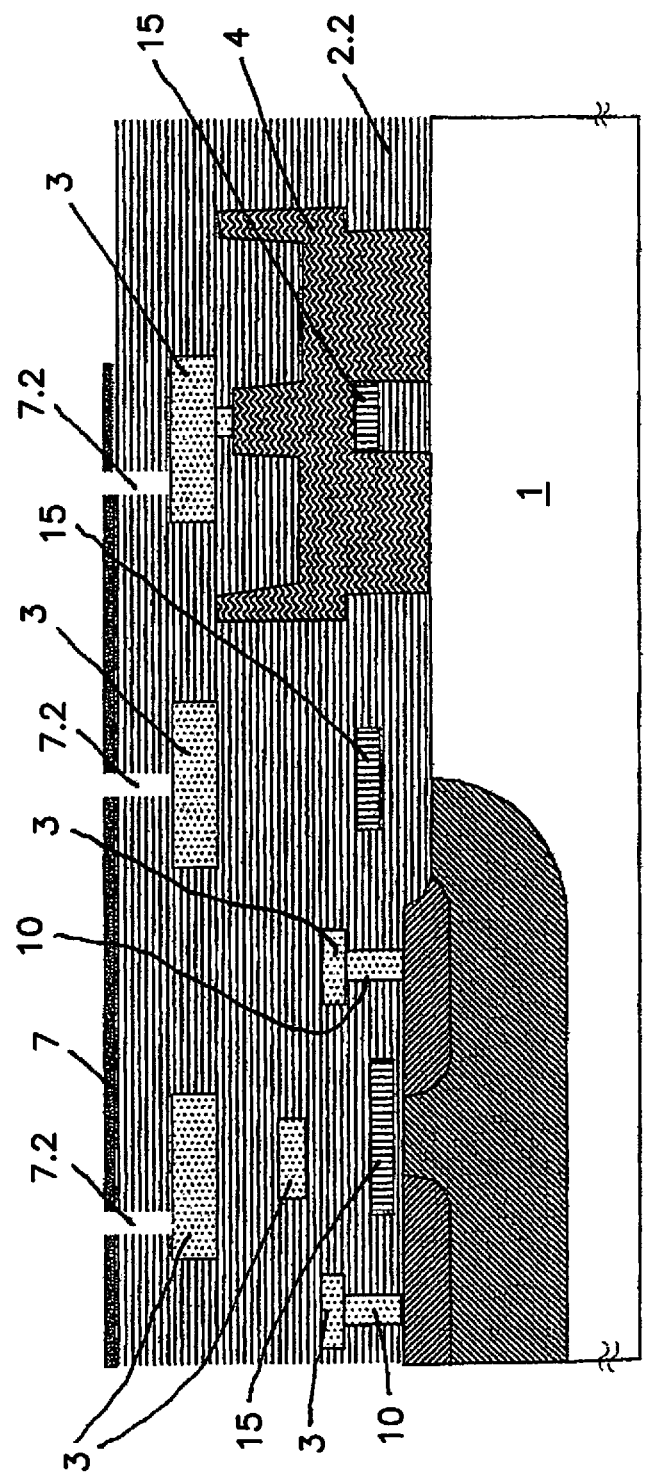
FIG. 17 shows a sectional illustration of the example according to FIG. 16, in which the perforations have been led as far as electrical contacting elements arranged within the insulator layer.

The perforations 7.1 can be deepened further by means of reactive ion etching and in the process locally defined removal of insulator layer material, with the result that the enlarged vias 7.2 can be formed, which are led as far as electrical contacting elements 3. This is illustrated in FIG. 17.

Figure 18:
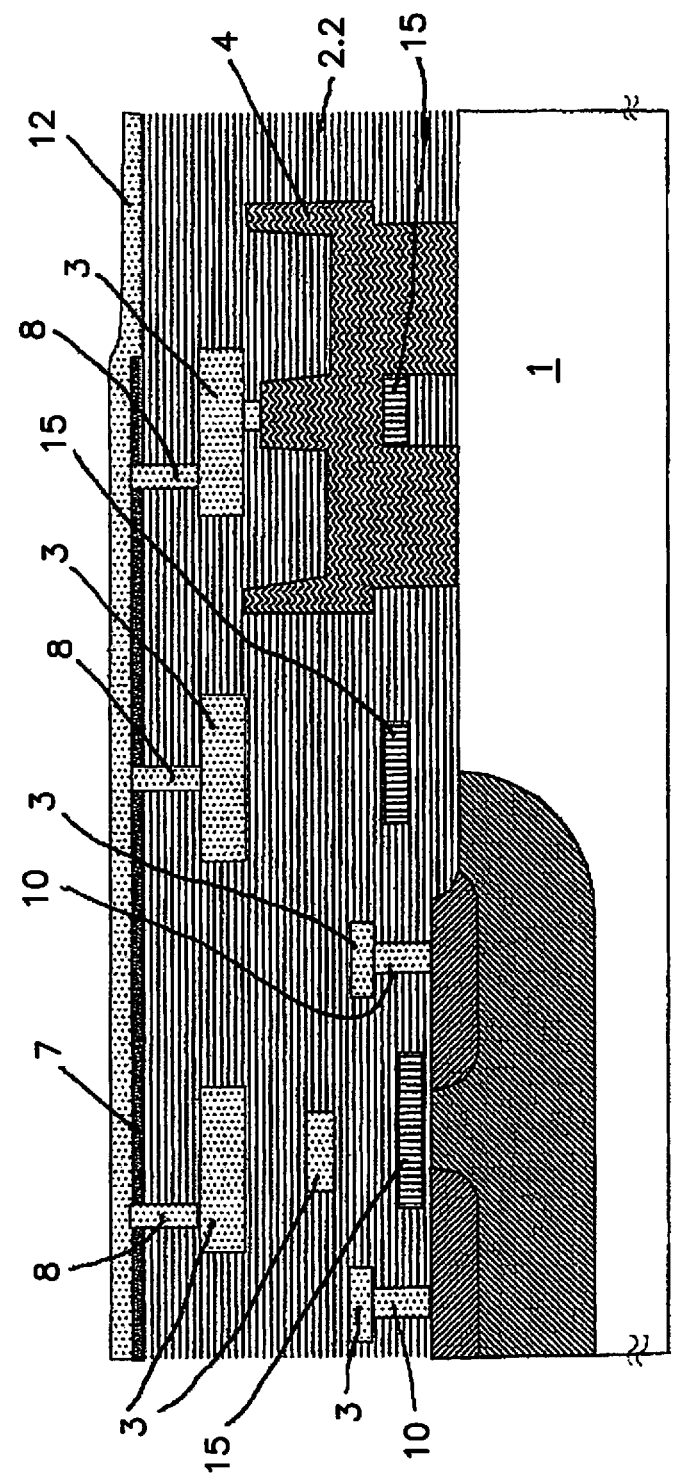
FIG. 18 shows a sectional illustration of the example according to FIG. 17, in which a metallization has been applied on the surface and electrical through contacts have been formed as far as the electrical contacting elements.

In accordance with FIG. 18, a metal layer 12 is applied again on the surface by sputtering, said metal layer being used to form through contacts 8 to the electrical contacting elements 3 formed last beforehand. The AlSiCu alloy or TiAl can again be used for this purpose.

Figure 19:
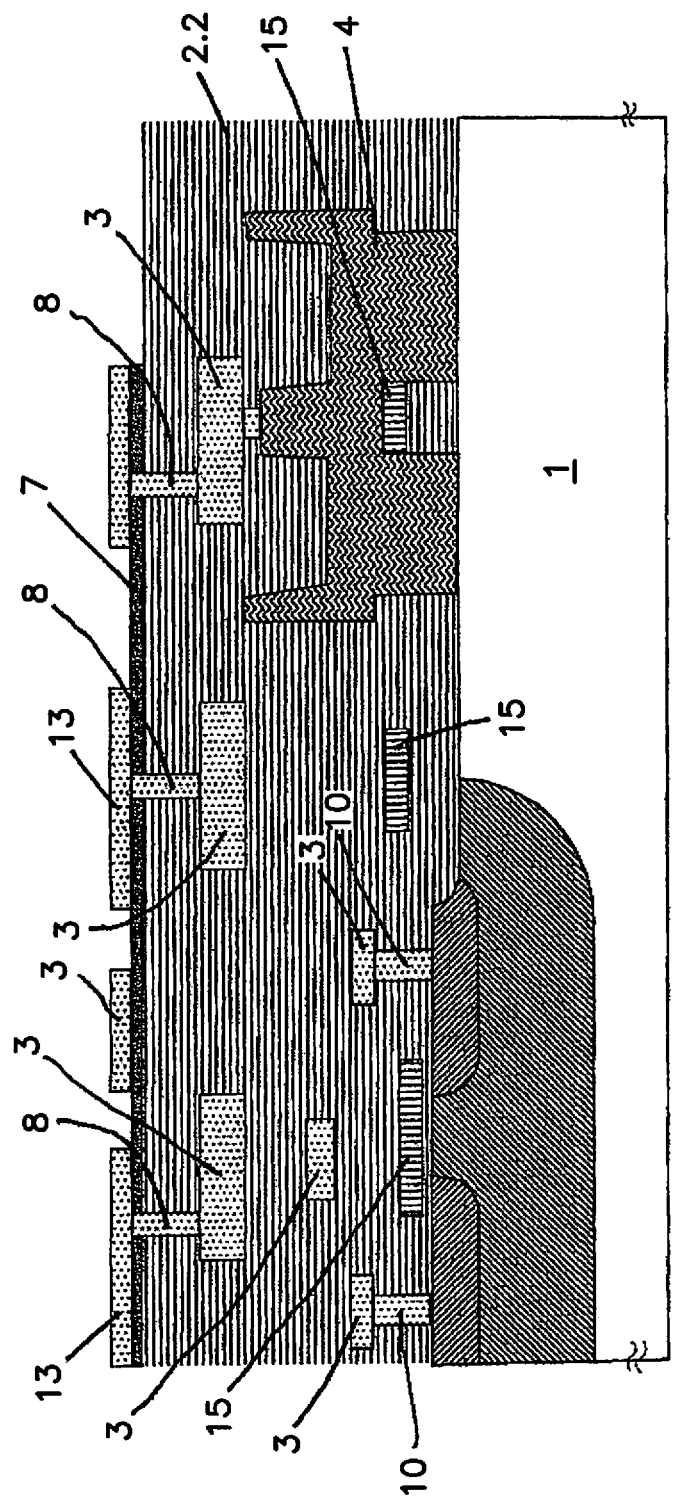
FIG. 19 shows a sectional illustration of the example according to FIG. 18, in which the final metallization has been removed in a locally defined manner.

With FIG. 19, the intention is to elucidate how a locally defined removal of the metal layer 12 is intended to be effected lithographically and by means of etching, said removal resulting in the formation of further electrical contacting elements 3 and also electrodes 13 on the surface of the barrier layer 7.

Figure 20:
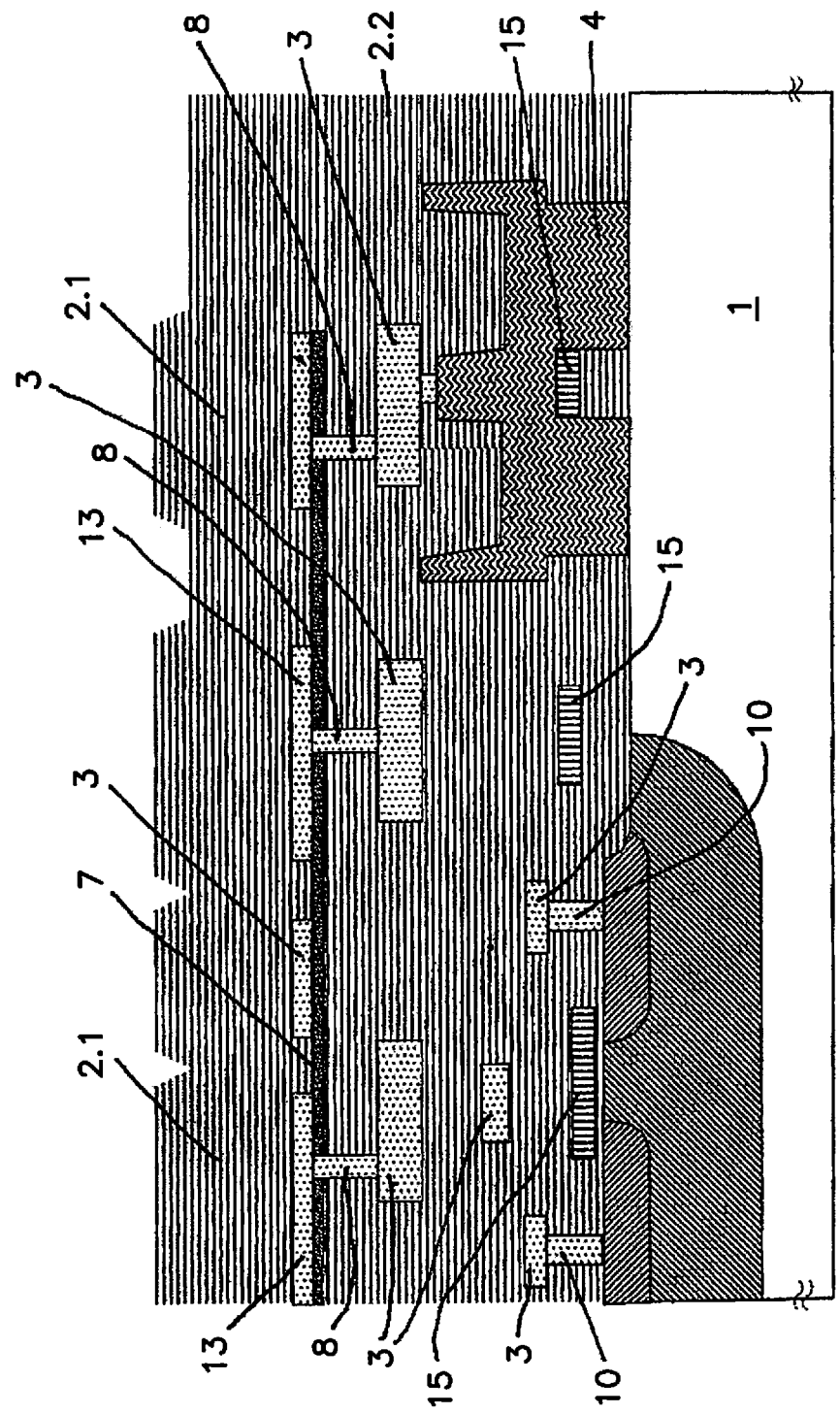
FIG. 20 shows a sectional illustration of the example according to FIG. 19, in which a sacrificial layer for the MEMS element has been formed on the surface of the metallized CMOS circuit.

For the formation of a microelectromechanical element 5, further sacrificial layer material is then deposited on the surface by means of PE-CVD technology, with the result that therein the last formed electrical contacting elements 3, the electrodes 13 and the barrier layer 7 are enclosed by material of the sacrificial layer 2.1 (FIG. 20).

Figure 21:
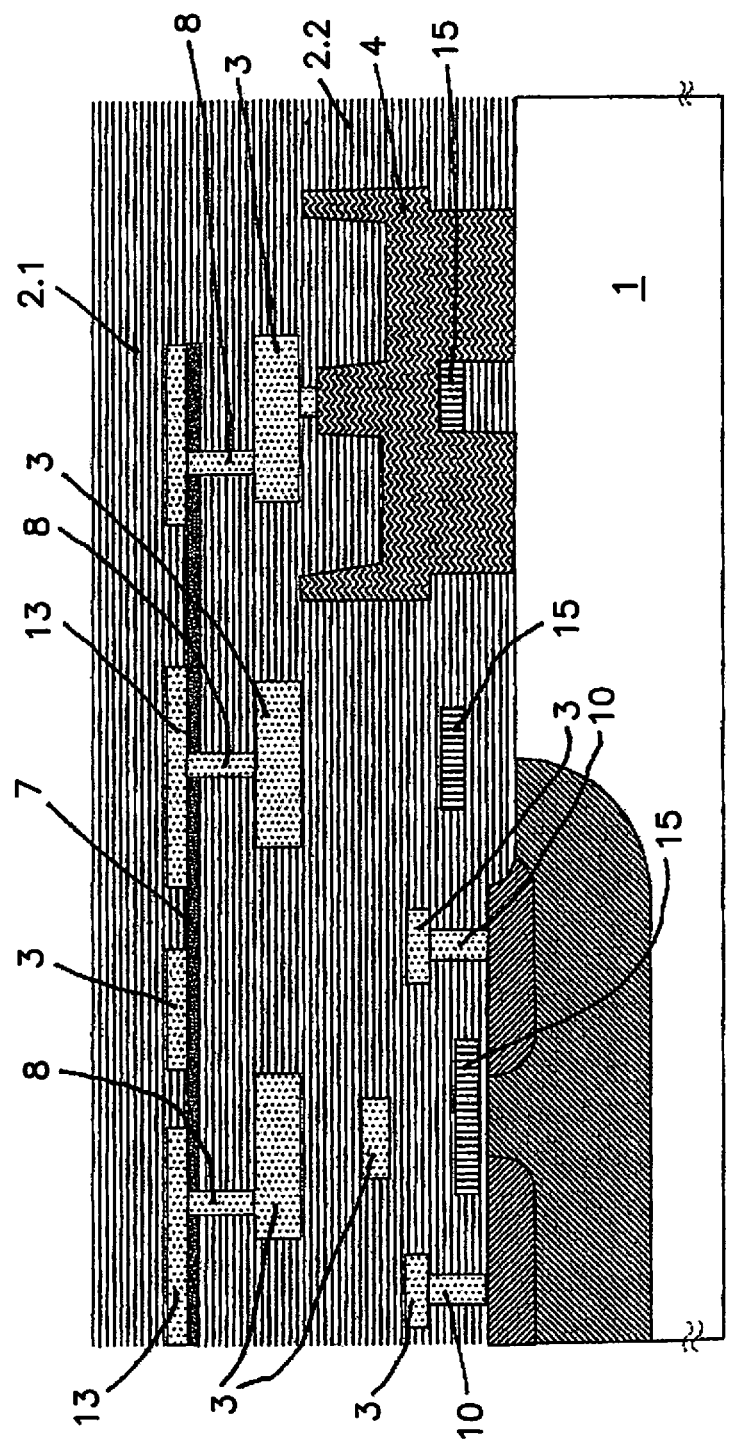
FIG. 21 shows a sectional illustration of the example according to FIG. 20, in which the surface of the sacrificial layer has been planarized.

In accordance with FIG. 21, the surface of the sacrificial layer 2.1 is planarized again by chemical mechanical polishing.

Figure 22:
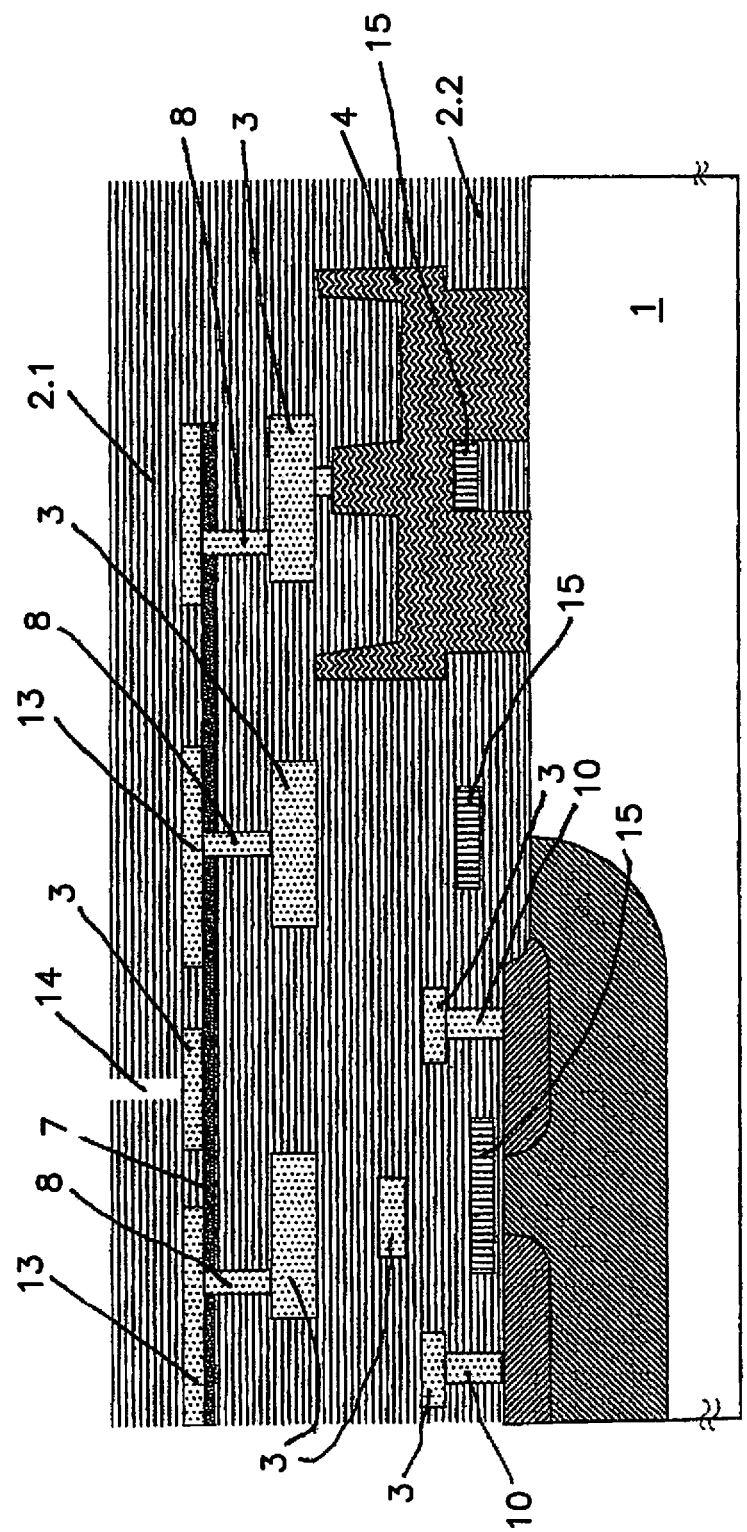
FIG. 22 shows a sectional illustration of the example according to FIG. 21, in which, in the previously formed region of the sacrificial layer, a perforation has been formed as far as an electrical contacting element.

It can be gathered from FIG. 22 that a further perforation 14 is formed, by reactive ion etching, through the sacrificial layer material proceeding from the surface as far as an electrical contacting element 3 embedded in the sacrificial layer 2.1 and arranged above the barrier layer 7.

Figure 23:
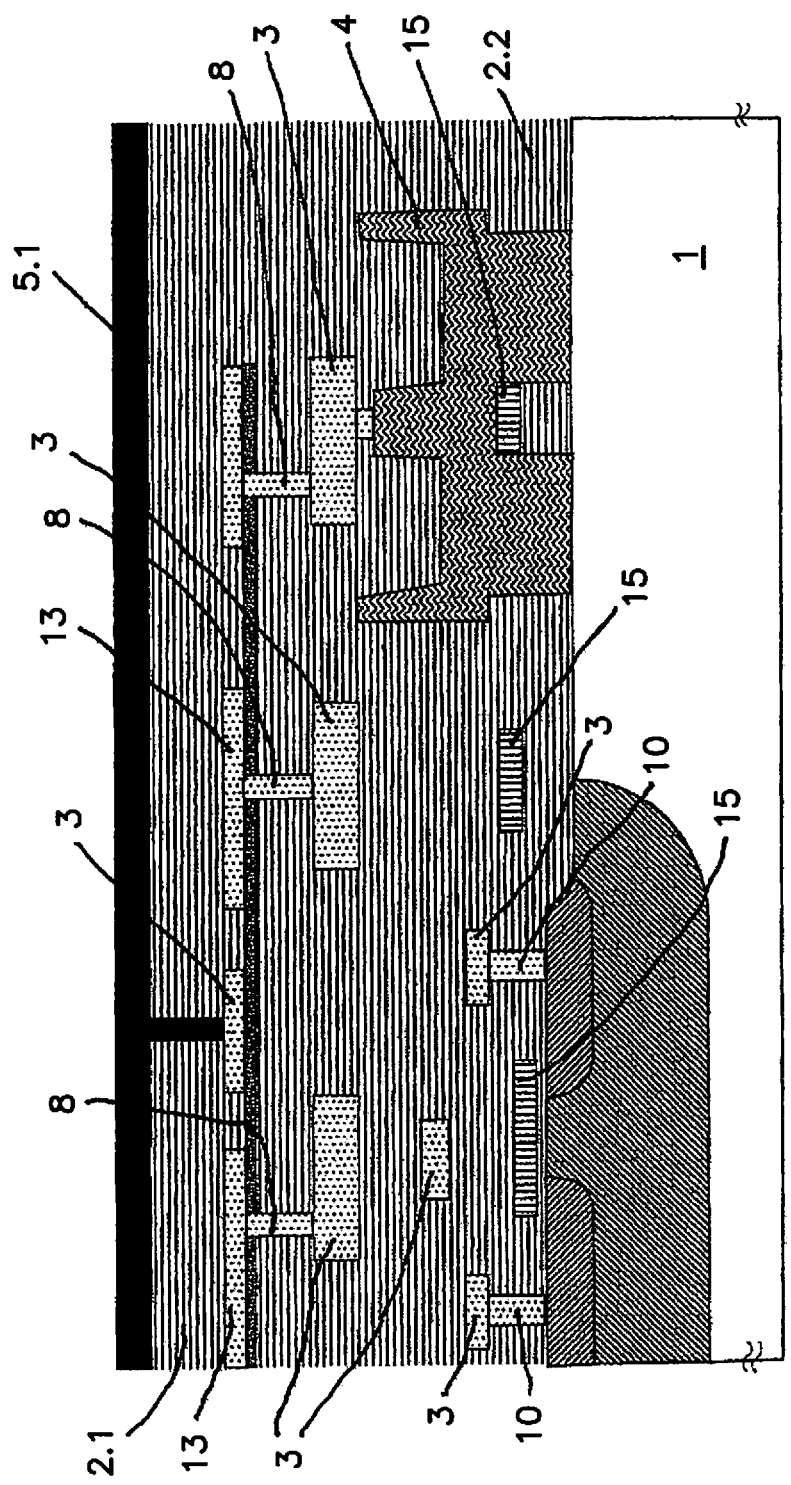
FIG. 23 shows a sectional illustration of the example according to FIG. 22, in which material for forming a microelectromechanical element has been applied on the planarized surface of the previously applied region of the sacrificial layer right into the perforation formed last.

After that, a layer of the material 5.1 with which the microelectromechanical element 5 is intended to be formed is formed and the perforation 14 is concomitantly filled with the material 5.1, with the result that in the case of an electrically conductive material for a microelectromechanical element 5 an electrically conductive connection to the corresponding electrical contacting element 3 can be produced. The layer can be formed by sputtering in the case of a metal and by a PE-CVD method in the case of other materials such as, for example, silicon (FIG. 23).

Figure 24:
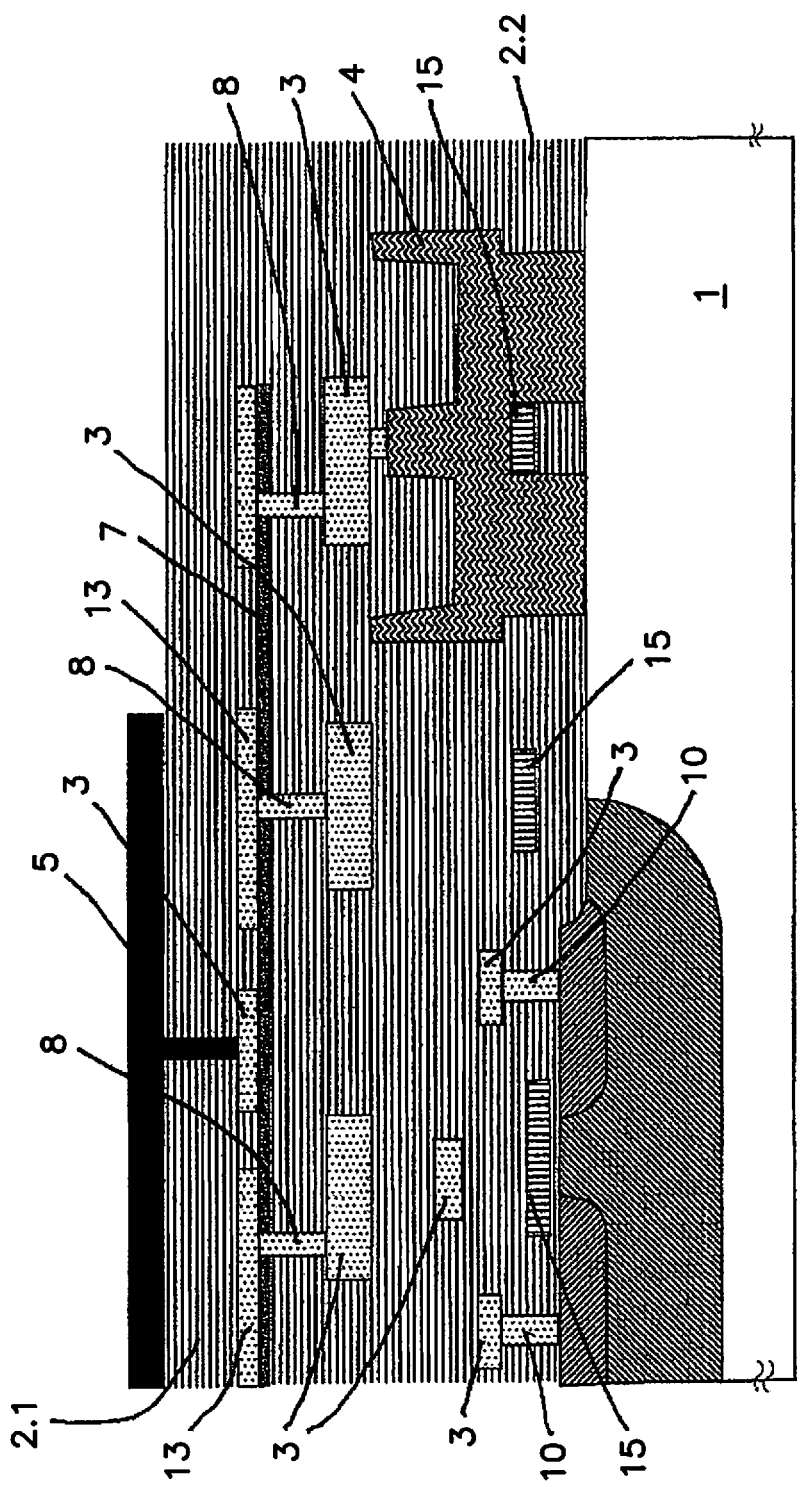
FIG. 24 shows a sectional illustration of the example according to FIG. 23, in which a locally defined material removal of the material for the formation of a microelectromechanical element has been carried out.

A part of the material with which the microelectromechanical element 5 is intended to be formed can be removed again by means of lithography and etching, as a result of which the dimensioning and geometric shape of the microelectromechanical element 5 can be influenced (FIG. 24).

After that, at the surface sacrificial layer material is removed by wet or vapor phase etching using hydrofluoric acid, with the result that the microelectromechanical element 5, embodied as a pivotable reflective element in this case, is pivotable freely movably about at least one axis. Here it is also possible to expose a part of the layer 4 at the outer edge, but this need not be the case.

Figure 25:
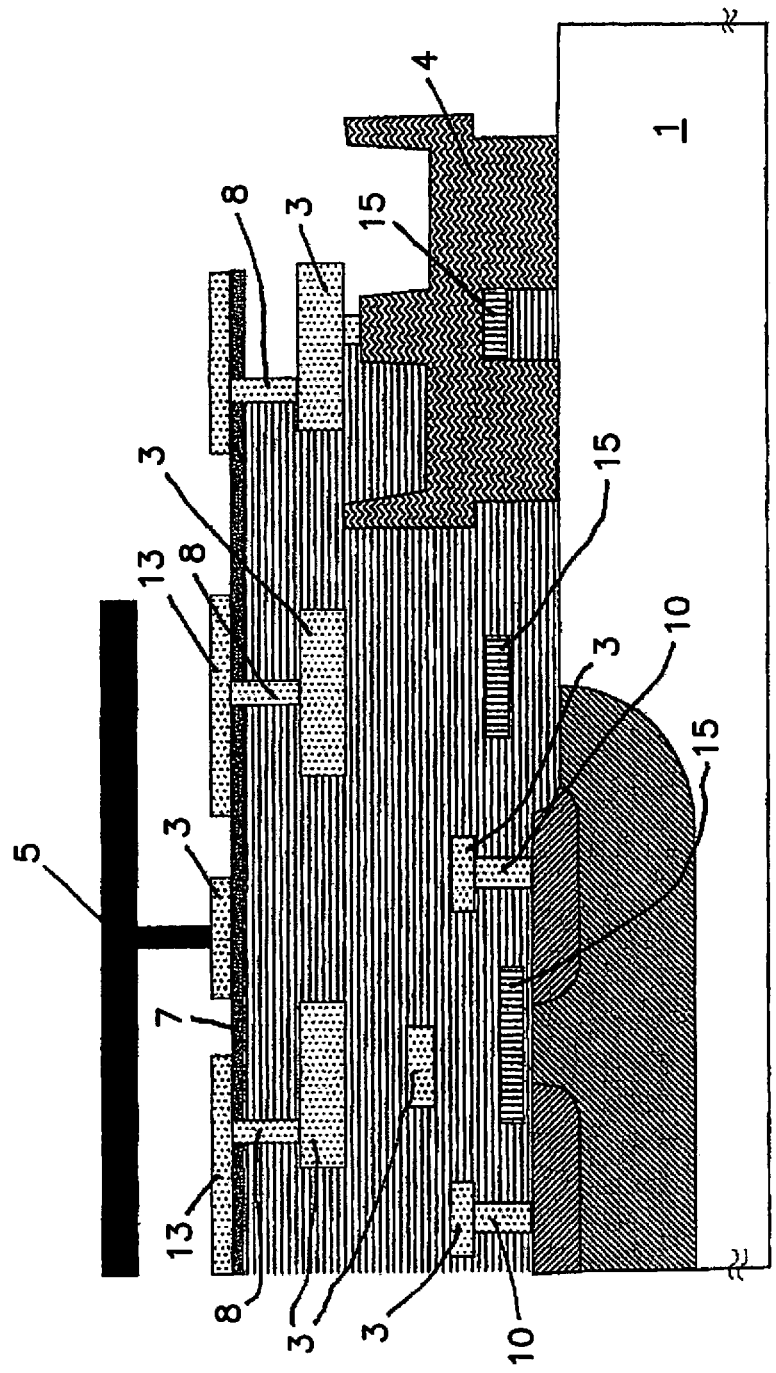
FIG. 25 shows a sectional illustration through a finished produced example of a MEMS component according to the invention, in which a region of the sacrificial layer has been removed, with the result that the microelectromechanical element is movable.

An example of a MEMS component according to the invention that has been processed in this way can be gathered from FIG. 25.

The invention claimed is:

1. A microelectromechanical component consists of at least one microelectromechanical element, electrical contacting elements, an insulation layer, and a sacrificial layer of silicon dioxide on a surface of a CMOS circuit substrate, the at least one microelectromechanical element is freely moveable in at least one direction, and the at least one micromechanical element is moveable because of a partial removal of the sacrificial layer,
    wherein at the outer edge of the microelectromechanical component, which extends radially around all the elements of the CMOS circuit substrate, a gas or fluid-tight closed layer resistant to hydrofluoric acid and consisting of silicon, germanium or aluminum oxide is located on the surface of the CMOS circuit substrate.

2. The component as claimed in claim 1, wherein the fluid-tight closed layer is formed with amorphous silicon.

3. The component as claimed in claim 1, wherein the fluid-tight closed layer consists of doped amorphous silicon or a chemical compound of silicon and germanium.

4. The component as claimed in claim 1, wherein a barrier layer composed of aluminum oxide is located on the surface of the microelectromechanical component and the microelectromechanical element is capable of moving.

5. The component as claimed in claim 1, wherein the fluid-tight closed layer is coated with at least one further layer, and the at least one further layer is a metal.

6. A method for producing the at least one microelectromechanical element as claimed in claim 1, applying the insulation layer comprising silicon dioxide on a surface of the CMOS circuit substrate; embedding electrical contacting elements into the insulation layer; forming
- in the insulator layer at an outer edge at least one trench extending as far as the surface of the CMOS circuit substrate extending radially around all elements of the CMOS circuit substrate; filling
- the at least one trench, at least in its bottom region, with the fluid-tight closed layer formed with silicon, germanium, a chemical compound of silicon and germanium or aluminum oxide; applying to
- the sacrificial layer a material with which at least one microelectromechanical element is formed; and then etching
- the sacrificial layer to partially remove it using hydrofluoric acid, wherein movability of the at least one microelectromechanical element is obtained.

7. The method as claimed in claim 6, substantially filling the at least one trench with silicon, germanium or aluminum oxide.

8. The method as claimed in claim 6, covering the fluid-tight closed layer with at least one further metal layer in the at least one trench.

9. The method as claimed in claim 6, forming in the sacrificial layer a closed barrier layer composed of aluminum oxide and, on that surface of the barrier layer which faces in the direction of the at least one microelectromechanical element, electrical contact elements or electrodes required for the actuation of the microelectromechanical element which are electrically conductively connected to the electrical contacting elements arranged below the barrier layer, and
- removing material of the sacrificial layer above the barrier layer by etching to achieve movability of the microelectromechanical element.

10. The method as claimed in claim 6, partially removing the material of the sacrificial layer by etching with hydrofluoric acid as liquid or gas.

11. The method as claimed in claim 6, depositing silicon or aluminum oxide in the at least one trench by means of PE-CVD technology, sputtering or ALD and forming the fluid-tight closed layer.

* * * * *